United States Patent
Drapkin et al.

(10) Patent No.: US 6,342,996 B1
(45) Date of Patent: Jan. 29, 2002

(54) SINGLE GATE OXIDE HIGH TO LOW LEVEL CONVERTER CIRCUIT WITH OVERVOLTAGE PROTECTION

(75) Inventors: Oleg Drapkin, North York; Grigori Temkine, Toronto, both of (CA)

(73) Assignee: ATI International SRL, Christ Church (BB)

( * ) Notice: Subject to any disclaimer, the term of this patent is extended or adjusted under 35 U.S.C. 154(b) by 0 days.

(21) Appl. No.: 09/350,625

(22) Filed: Jul. 9, 1999

(51) Int. Cl.$^7$ ................................................. H02H 3/20
(52) U.S. Cl. ........................... 361/91.1; 361/56; 326/81; 327/333
(58) Field of Search ........................... 361/56, 111, 91.1; 327/333, 205, 206, 309, 321, 323; 326/68, 80, 81, 21, 56, 62

(56) References Cited

U.S. PATENT DOCUMENTS

| | | |
|---|---|---|
| 5,319,259 A | 6/1994 | Merrill ....................... 361/91.1 |
| 5,333,093 A | 7/1994 | Krautschneider et al. ..... 361/56 |
| 5,905,621 A | 5/1999 | Drapkin ....................... 361/111 |

Primary Examiner—Ronald W. Leja
(74) Attorney, Agent, or Firm—Vedder, Price, Kaufman & Kammholz

(57) ABSTRACT

An input stage circuit and method provides voltage level conversion and overvoltage protection for an input stage circuit using a single gate oxide pass circuit and a single gate oxide voltage level shifting circuit. In one embodiment, the circuit and method includes receiving an input signal through the single gate oxide voltage pass circuit wherein the input signal can have a voltage level higher and lower than a first reference voltage for the voltage pass circuit. An output signal from the voltage pass circuit is provided to a single gate oxide voltage level shifting circuit that shifts a voltage level of the input signal from a first logic high level to a second lower logic high level when the input signal is above a reference voltage. The circuit and method provides a scaled output signal that has a maximum voltage level substantially equal to a reference voltage associated with the level shifting circuit when the input signal exceeds the reference voltage so that an output signal to a protected circuit, such as a core logic circuitry, is above an input signal less a threshold voltage drop that occurs through the voltage pass circuit. In another embodiment, hysteresis is added for an output signal from the voltage level shifting circuit to provide suitable noise reduction prior to the converted signal being passed to subsequent stages.

15 Claims, 2 Drawing Sheets

SINGLE GATE OXIDE HIGH TO LOW LEVEL CONVERTER CIRCUIT WITH OVERVOLTAGE PROTECTION

FIELD OF THE INVENTION

The invention relates generally to over voltage protection circuits for protecting other circuits from higher than desired voltage levels, and more particularly to voltage scaling circuits for protecting an input to a protected circuit.

BACKGROUND OF THE INVENTION

With the continued demand for higher speed and lower power consumption integrated circuits a need exists for simple, low cost and reliable over voltage protection circuits. For example, CMOS based video graphics chips with 128 input/output ports (I/O) ports or more are required to operate at clock speeds of 125 MHz to 250 MHz or higher. Such devices may use a 2.5 V power supply for much of its logic to reduce power consumption. One way to increase the operating speed of such devices is to decrease the gate length of core circuitry transistors. However, a decrease in the gate length of MOS devices can reduce the gate breakdown voltage to lower levels. For example, where an integrated circuit contains digital circuitry that operates from a 2.5 V source and is fabricated using silicon dioxide gate thickness of 50 Angstroms, a resulting gate breakdown voltage may be approximately 3.5 volts. Such IC's must often connect with more conventional digital devices that operate at 5 V or 3.3 V. A problem arises when the core logic circuitry (operating at 2.5 volts) receives 5 V digital input signals from peripheral devices on input pins. Such standard 5 V input signals or 3.3 V input signals can cause breakdown damage if suitable voltage protection is not incorporated.

FIG. 1 shows a known over voltage protection arrangement that attempts to overcome this problem. As seen, a resistor R is placed in the input path from an input pin P to the input I of a MOS based core logic stage, such as an input/output port on a CPU or other processing unit. A clamping diode D is placed across the input I of the core logic stage and is connected to a 2.5 V supply voltage used by the core logic to clamp over voltages coming from pin P. In operation, resistor R restricts current flow to the core logic circuit and a voltage drop occurs across the resistor. When an input voltage is high enough to cause the diode D to conduct, the diode clamps the input voltage to a fixed level (2.5 V+diode junction voltage drop). Several problems arise with such a configuration. If the core logic is fabricated with gate oxide thickness of 50 angstroms, a breakdown voltage of only 3.5 volts is required to damage the core logic stage (0.7V/A*50a=3.5 V). With the diode drop of approximately 0.7 volts, a 3.2 V input voltage is a maximum input voltage to the core logic stage, however this is very close to the 3.5 V breakdown voltage so that over temperature and time, circuit reliability may be compromised. Also, the clamp diode D allows additional current to flow through the substrate which can cause latch-up of core logic circuitry.

Another problem is the use of resistor R. Such resistive elements take up large areas on integrated circuits and dissipate large amounts of power, hence heat, when an input voltage such as 5 volts is placed on pin P. In addition, a large time delay can occur due to the resistor R and the parasitic capacitance of the gate junction of the core logic circuit. This time delay reduces the speed of operation of the system.

Other overvoltage protection circuits are known, such as those disclosed in U.S. Pat. No. 5,905,621 entitled "Voltage Scaling Circuit for Protecting an Input Node to a Protected Circuit," which may include single gate oxide overvoltage protection circuits. Such circuits may be quite useful in many applications. However, in the embodiment where an input voltage is provided to an nmos voltage pass device, the output from the overvoltage protection circuit may be limited to a gate supply voltage minus a threshold voltage of the voltage pass device. However, with protected circuits having lower source voltages, for example, it may be desirable to have the output of the protection circuit without any additional threshold voltage drop.

Another known overvoltage protection circuit is disclosed, for example, in U.S. Pat. No. 5,319,259, entitled "Low Voltage Input and Output Circuits With Overvoltage Protection," issued on Jun. 7, 1994. Such a circuit utilizes among other things, a feedback path to attempt to pull up an output of a protection circuit which serves as the input to another stage. However, such a circuit can start to consume current when the voltage input switches from a high level to a low level. As such, the protection circuit may unnecessarily consume current if, for example, the input stage providing the input signal does not have sufficient drive current to adequately switch an input pass transistor.

Consequently there exists a need for a single gate oxide protection circuit that reduces power consumption, improves the speed of operation of a system in a simple and reliable manner. It would desirable if the protection circuit provided, when needed, an output voltage that was substantially the same as the reference voltage of protection circuit without input current consumption as well as without DC current consumption.

BRIEF DESCRIPTION OF THE DRAWINGS

The invention will be more readily understood in view of the drawings wherein.

DETAILED DESCRIPTION OF A PREFERRED EMBODIMENT OF THE INVENTION

Briefly, an input stage circuit and method provides voltage level conversion and overvoltage protection for an input stage circuit using a single gate oxide pass circuit and a single gate oxide voltage level shifting circuit. In one embodiment, the circuit and method includes receiving an input signal through the single gate oxide voltage pass circuit wherein the input signal can have a voltage level higher and lower than a first reference voltage for the voltage pass circuit. An output signal from the voltage pass circuit is provided to a single gate oxide voltage level shifting circuit that shifts with the help of inverter a voltage level of the input signal from a first logic high level to a second lower logic high level when the input signal is above a reference voltage. The circuit and method provides a scaled output signal that has a maximum voltage level substantially equal to a reference voltage associated with the level shifting circuit when the input signal exceeds the reference voltage so that an output signal to a protected circuit, such as a core logic circuitry, is above an input signal less a threshold voltage drop that occurs through the voltage pass circuit. In another embodiment, hysteresis is added for an output signal from the voltage level shifting circuit to provide suitable noise reduction prior to the converted signal being passed to subsequent stages.

Figure 1:
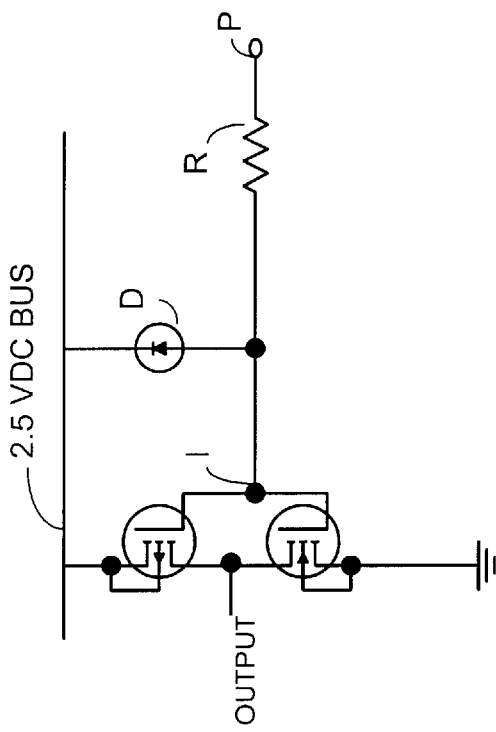
FIG. 1 is a prior art overvoltage protection circuit.
Figure 2:
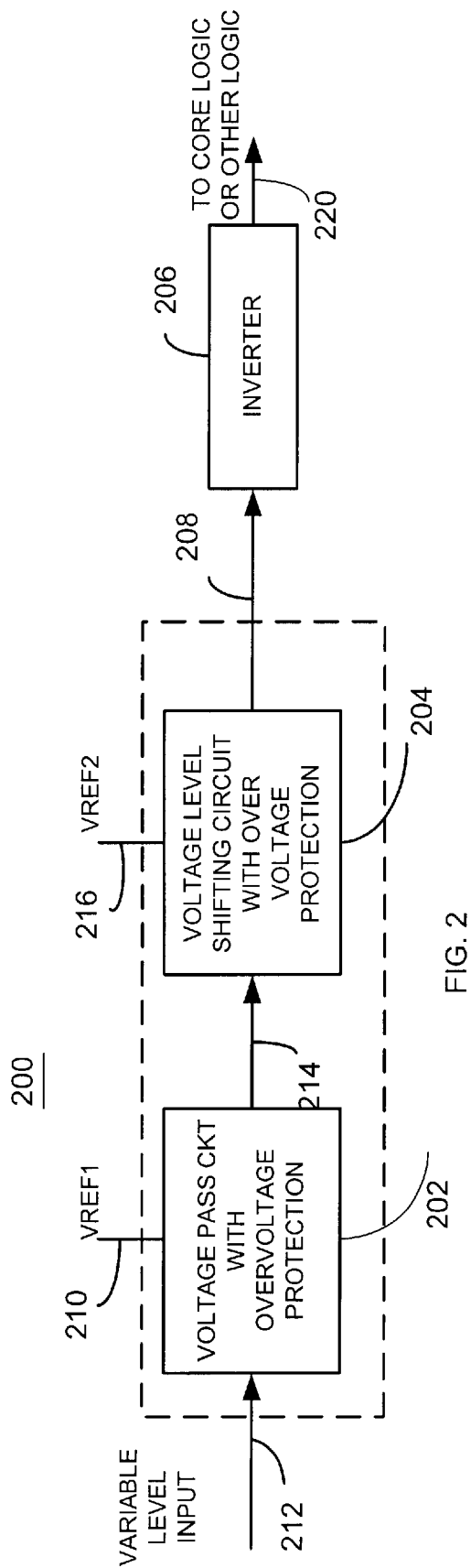
FIG. 2 is a block diagram illustrating one example of the invention in accordance with one embodiment of the invention.

FIG. 2 illustrates one example of an input stage circuit 200 that may be employed in any suitable circuit. For example, the input stage circuit 200 may be used as an interface to core circuitry that has a power supply of 2.5 V or any other suitable voltage level in an integrated circuit, such as a video and/or graphics processing circuit, microprocessor or any other suitable integrated circuit. The input stage circuit 200 is designed to receive a plurality of different voltage ranges such as 0 to 5 V, 0 to 3.3 V, 0 to 2.5 V, or any other suitable voltage range. Accordingly, the input stage circuit 200 allows interfacing to different circuits that may supply such voltage levels. This can allow the input stage circuit 200 to interface to newer and older circuits and circuits having different power supply levels and output signal levels.

The input stage circuit 200 includes a voltage pass circuit 202 with overvoltage protection, and a single gate oxide voltage level shifting circuit 204 with overvoltage protection. An inverter 206 or any other suitable logic at the output of the shifting circuit 204 provides non inverted output 220 to the core logic or other logic circuits. The voltage pass circuit 202 is made up of one or more single gate oxide devices having the same gate oxide thickness as the devices making up the single gate oxide voltage level shifting circuit 204. Accordingly, the input stage circuit 200 offers an advantage, among others, in maintaining a single fabrication process for all components therein. Preferably, the single gate oxide devices are the same gate oxide thickness as the circuit to which it provides a scaled output voltage 220. The external circuitry receiving the scale output voltage 220 includes, for example, core logic circuitry or any other suitable logic. The voltage pass circuit 202 is made of a single gate oxide thickness and includes a first terminal operatively coupled to receive a first reference voltage 210. As used herein, the term "terminal" can be any wire, pad, junction, trace, or any other suitable mechanism that allows coupling, either directly or indirectly, to receive electrical or optical energy. In addition, the voltage pass circuit 202 includes a second terminal operatively coupled to receive an input signal 212 that can have a voltage level higher and lower than the reference voltage 210. The voltage pass circuit 202 outputs a passed voltage 214 out a third terminal.

The reference voltage 210 is set at a level to provide a gate to source or gate to drain voltage within acceptable normal operating ranges. This provides overvoltage protection for the voltage pass circuit 202.

The single gate oxide voltage level shifting circuit 204 is operative to provide a scaled output signal 208 that has a maximum voltage level substantially equal to a reference voltage 216. The single gate oxide voltage level shifting circuit 204 includes a terminal for receiving a passed voltage 214 and an output signal terminal that outputs the scale output voltage 208.

Figure 3:
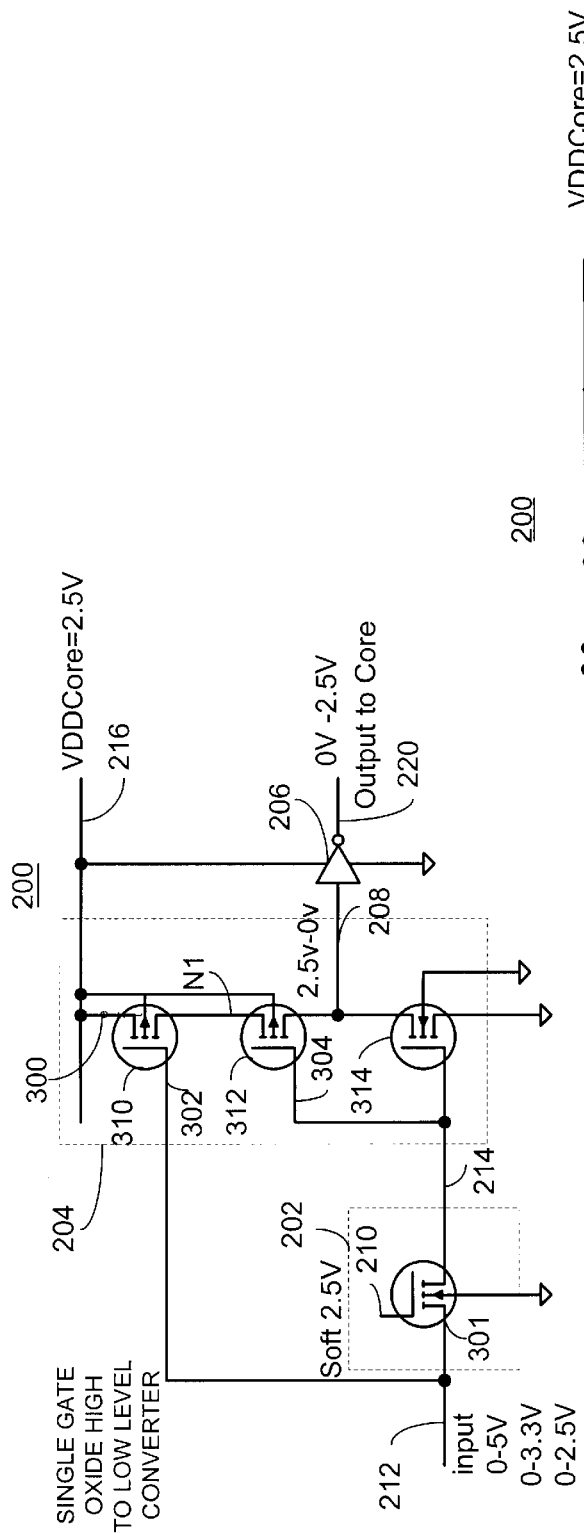
FIG. 3 is one example of the voltage scaling circuit in accordance with one embodiment of the invention.

FIG. 3 illustrates an example of one embodiment of the input stage circuit 200. In this embodiment, the voltage pass circuit 202 includes an nmos transistor device 301 having a gate as a first terminal, a source as a second terminal to provide the passed voltage 214, and a drain as a third terminal to receive the variable input signal 212.

The single gate oxide voltage level shifting circuit 204 includes a terminal 300 operatively coupled to the reference voltage 216, a terminal 302 operatively coupled to receive the input signal 212, and a terminal 304 operatively coupled to the third terminal of the voltage pass circuit to receive the passed voltage 214. The single gate oxide voltage level shifting circuit 204 in this embodiment includes a pmos transistor 310, a voltage protection pmos transistor 312 and an nmos transistor 314. The pmos transistor 310 has a gate operatively coupled to receive the input signal 212, a source operatively coupled to the reference voltage 216 and a drain operatively coupled to a source of the pmos transistor 312. The pmos transistor 312 has a gate operatively coupled to the source of the nmos pass transistor and a drain operative to provide a scaled output signal The drain is also coupled to the source of nmos transistor 314. The nmos transistor 314 has a source that also provides scaled output signal 208, a gate operatively coupled to receive the passed input voltage, and operatively coupled to the source of the nmos transistor pass circuit, and a drain operatively coupled to ground. The transistors 310, 312, 314 and the pass transistor 301 are fabricated as single gate oxide devices, preferably having a gate oxide thickness of less than 50 Å. It will be recognized that any suitable transistor configuration may also be used, if desired. In addition, coupling may be either direct or indirect depending upon the desired implementation of the circuit.

The reference voltage 216 may be, for example, a 2.5 V core logic supply voltage or any other suitable reference voltage. The reference voltage 210 may be, for example, the same voltage as the reference voltage 216 but isolated from the reference voltage 216, if desired.

In operation, the input stage circuit 200 and inverter 206 outputs the scaled output voltage 220 to be substantially equal in voltage range to the input voltage range 212 when, for example, the input voltage is at a low voltage level. For example, when a variable input voltage 212 ranges from 0 to 2.5 V, the output voltage signal 208 will range from 2.5 V to 0 V. When passed to the inverter 206, the output voltage 220 to core circuitry or other circuitry, for example, will be 0 V to 2.5 V. The voltage level shifting circuit 204 together with inverter 206 provides an output voltage 220 that is substantially the same range as the input voltage at low voltage levels. Also, the maximum output voltage 208 as well as maximum output voltage 220 is substantially the same voltage as the reference voltage 216, thereby avoiding a voltage threshold drop incorporated by the voltage pass transistor 301. During overvoltage conditions, such as where the input voltage 212 goes from 0 to 5 V, transistors 310, 312 and 314 allow the full 0 V to 2.5 V range without current draw. In addition, the transistors 310, 312 and 314 are protected from overvoltage conditions by providing a gate to drain and gate to source potential within normal operating ranges for the devices.

As the input signal 212 goes from the logic 0 to a logic 1, the pass transistor 301 limits the pass voltage 214 to approximately the reference voltage 210 minus threshold voltage for all logic highs, so that transistors 301 and 314 are not damaged due to overvoltage conditions. Transistor 314 turns on, transistor 310 turns off and the output voltage 208 is forced to ground. Where, for example, the input voltage is 5 V, the voltage at node N1 is kept low enough to avoid damage to transistors 310 and 312 during such overvoltage conditions (e.g., where the reference voltage is, for example, 2.5 V and the input logic high voltage is 5 V). However, the voltage at N1 needs to be high enough to keep the transistor 312 off but not too low to damage the gate to drain path. When transistor 310 is off, there is no current through transistor 312. In that case transistor 312 gate to source voltage is lower than, for example, the passed voltage 214 plus transistor 312 threshold voltage (in this example, this sum is ~2.5V). Transistor 312 isolates transistor 314 and transistor 310 drains. When transistor 314 is in an "on" condition and transistor 310 is in an "off" condition, transistor 310 gate to drain voltage would be 5V without transistor 312 isolation. In that case single gate oxide transistor 310 would be damaged.

As such, the circuit operates so that when the input voltage is 0 V, the passed voltage 214 is approximately 0 V, the output voltage is approximately 2.5 V (208) the voltage at N1 is approximately 25 V. The output to the core is 0 V after being inverted. In addition, the transistor 210 is "on", transistor 314 is "off", transistor 310 is "on", and transistor 312 is "on". When the input voltage is 5 V, the passed voltage is approximately 1.8 V, the output voltage 208 is approximately 0 V since transistor 314 is on. The voltage at N1 is 2.5 V, which is high enough to avoid damage between the gate and drain transistor 310 as well as the source to gate transistor 312. This is also low enough to keep the transistor 312 off. The output voltage to the core is 2.5 V after being inverted.

Figure 4:
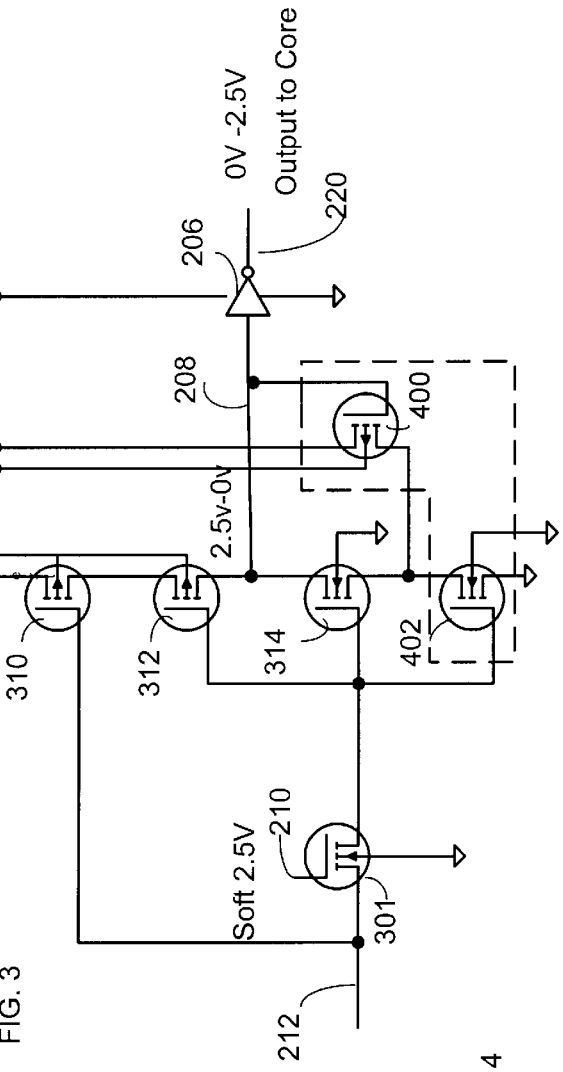
FIG. 4 is a circuit diagram illustrating the circuit of FIG. 3 also employing a Schmidt trigger circuit to reduce noise.

FIG. 4 shows another embodiment of the circuit 200 that includes a hysteresis circuit operatively coupled to receive the output signal 208 to facilitate noise reduction for a scaled output signal. In this embodiment, the hysteresis circuit is in the form of a Schmidt trigger circuit having a plurality of transistors 400 and 402. As such, the output signal 208 may be suitably filtered to avoid glitches being passed through to core logic circuitry or other circuitry connected to an output of the input stage circuit 200. However, any suitable noise reduction circuitry may be used.

It should be understood that the implementation of other variations and modifications of the invention in its various aspects will be apparent to those of ordinary skill in the art, and that the invention is not limited by the specific embodiments described. For example, the transistors may be non-mos devices or any suitable logic. It is therefore contemplated to cover by the present invention, any and all modifications, variations, or equivalents that fall within the spirit and scope of the basic underlying principles disclosed and claimed herein.

What is claimed is:

1. An input stage circuit that provides voltage level conversion and includes overvoltage protection comprising:
    a voltage pass circuit having a first terminal operatively coupled to receive a first reference voltage, a second terminal operatively coupled to receive an input signal that can have a voltage level higher and lower than the first reference voltage, and a third terminal, wherein the voltage pass circuit is made of a single gate oxide thickness; and
    a single gate oxide voltage level shifting circuit having a single gate oxide overvoltage protection circuit operatively coupled between the third terminal of the voltage pass circuit and an output signal terminal of the voltage level shifting circuit, and wherein the voltage level shifting circuit is operative to provide a scaled output signal that has a maximum voltage level substantially equal to a second reference voltage when the input voltage exceeds the second reference voltage.

2. The circuit of claim 1 wherein the voltage pass circuit is a transistor.

3. The circuit of claim 1 wherein the single gate oxide voltage level shifting circuit includes a fourth terminal operatively coupled to the second reference voltage, a fifth terminal operatively coupled to receive the input signal, and a sixth terminal operatively coupled to the third terminal of the voltage pass circuit.

4. The circuit of claim 1 wherein the single gate oxide voltage pass circuit includes an nmos transistor device having a gate as the first terminal, a source as the second terminal and a drain as the third terminal.

5. The circuit of claim 1 wherein the single gate oxide voltage level shifting circuit includes at least a first transistor operatively coupled to the second reference voltage and to the input signal, a second transistor operatively coupled to the first transistor and to the third terminal, and a third transistor operatively coupled to the second transistor and to the third terminal of the voltage pass circuit.

6. The circuit of claim 5 including a hysteresis circuit operatively coupled to the third terminal and operatively coupled to the output signal terminal to facilitate noise reduction for a scaled output signal.

7. The circuit of claim 6 wherein the hysteresis circuit is a Schmidt trigger circuit.

8. The circuit of claim 5 wherein the transistors of the single gate oxide voltage level shifting circuit and the single gate oxide voltage pass circuit have a gate oxide thickness of 50 A or less and wherein the input signal is one of a plurality of at least three different voltage ranges.

9. An input stage circuit that provides voltage level conversion and includes overvoltage protection comprising:
    at least an nmos voltage pass transistor having a gate operatively coupled to receive a first reference voltage, a drain operatively coupled to receive an input signal that can have a voltage level higher and lower than the first reference voltage, and a source for outputting a passed input signal; and
    a single gate oxide voltage level shifting circuit having a first pmos transistor, a second pmos transistor and an nmos transistor wherein the first pmos transistor has a gate operatively coupled to receive the input signal, a source operatively coupled to a second reference voltage, and a drain operatively coupled to a source of the second pmos transistor, and wherein the second pmos transistor has a gate operatively coupled to the source of the nmos pass transistor and a drain operative to provide a scaled output signal, and wherein the nmos transistor has a source operatively coupled to the drain of the second pmos transistor, and a gate operatively coupled to receive the passed input signal; and
    wherein the nmos voltage pass transistor, the first pmos transistor, the second pmos transistor and the nmos transistor are fabricated as single gate oxide devices.

10. The circuit of claim 9 including a hysteresis circuit operatively coupled to the source of the nmos voltage pass transistor and operatively coupled to the scaled output signal to facilitate noise reduction for the scaled output signal.

11. The circuit of claim 10 wherein the hysteresis circuit is a Schmidt trigger circuit.

12. The circuit of claim 9 wherein the first and second reference voltages are 2.5V and wherein the input signal can vary between at least 0–5V.

13. The circuit of claim 9 wherein the transistors of the single gate oxide voltage level shifting circuit and the single gate oxide voltage pass transistor have a gate oxide thickness of 50 A or less and wherein the input signal is one of a plurality of at least three different voltage ranges.

14. A method for providing voltage level conversion and overvoltage protection for an input stage circuit comprising the steps of:
    receiving an input signal through a single gate oxide voltage pass circuit wherein the input signal can have a voltage level higher and lower than a first reference voltage for the voltage pass circuit; and
    shifting a voltage level of the input signal from first logic high level to a second lower logic high level through a single gate oxide voltage level shifting circuit operatively coupled to a second reference voltage and also having a single gate oxide overvoltage protection circuit, to provide a scaled output signal that has a maximum voltage level substantially equal to the second reference voltage when the input signal exceeds the second reference voltage.

15. The method of claim 14 including providing hysteresis for an output signal terminal to facilitate noise reduction for the scaled output signal from the single gate oxide voltage level shifting circuit.

* * * * *